United States Patent
Dannels

(10) Patent No.: US 10,089,722 B2
(45) Date of Patent: Oct. 2, 2018

(54) APPARATUS AND METHOD FOR REDUCING ARTIFACTS IN MRI IMAGES

(71) Applicant: Toshiba Medical Systems Corporation, Otawara-shi (JP)

(72) Inventor: Wayne R. Dannels, Vernon Hills, IL (US)

(73) Assignee: Toshiba Medical Systems Corporation, Otawara-shi (JP)

( * ) Notice: Subject to any disclaimer, the term of this patent is extended or adjusted under 35 U.S.C. 154(b) by 58 days.

(21) Appl. No.: 15/395,556

(22) Filed: Dec. 30, 2016

(65) Prior Publication Data

US 2018/0189930 A1    Jul. 5, 2018

(51) Int. Cl.
*G06T 5/00*    (2006.01)
*G06T 5/50*    (2006.01)
(Continued)

(52) U.S. Cl.
CPC .......... *G06T 5/002* (2013.01); *G01R 33/5619* (2013.01); *G06T 5/50* (2013.01);
(Continued)

(58) Field of Classification Search
CPC .............. G01R 33/5619; G06T 11/005; G06T 2207/10088; G06T 2207/20224
See application file for complete search history.

(56) References Cited

U.S. PATENT DOCUMENTS 7,840,045 B2    11/2010    Guo et al.
7,863,893 B2 *  1/2011     Griswold ........... G01R 33/5611
                                                    324/307
(Continued)

FOREIGN PATENT DOCUMENTS

KR    20160065786    6/2016

OTHER PUBLICATIONS

P.Kellman, et al., "Ghost Artifact Cancellation Using Phased Array Processing" http://www.ncbi.nlm.nih.gov/pmc/articles/PMC2041920/, Aug. 2001, vol. 46, Issue. 2, pp. 335-343.

(Continued)

*Primary Examiner* — Qian Yang
(74) *Attorney, Agent, or Firm* — Oblon, McClelland, Maier & Neustadt, L.L.P.

(57) ABSTRACT

Described herein is an apparatus and method for reducing artifacts in MRI images. The method includes acquiring a first set of data by under-sampling a first portion of a k-space at a first rate, and a second set of data by under-sampling a second portion of the k-space at a second rate. The method generates a first intermediate image and a second intermediate image based on the acquired first set of data and the acquired second set of data, respectively, and constructs a difference image including artifacts based on the generated first intermediate image and second intermediate image. The method includes reconstructing a final image, by selectively combining the first intermediate image with the second intermediate image, wherein the combining is based on identifying, for each artifact included in the difference image, one of the first intermediate image and the second intermediate image as being a source of the artifact.

20 Claims, 13 Drawing Sheets

(51) Int. Cl.
*G06T 11/00* (2006.01)
*G01R 33/561* (2006.01)
(52) U.S. Cl.
CPC .. *G06T 11/005* (2013.01); *G06T 2207/10088* (2013.01); *G06T 2207/20224* (2013.01)

(56) References Cited

U.S. PATENT DOCUMENTS

| | | | | |
|---|---|---|---|---|
| 2007/0103156 | A1* | 5/2007 | Katscher | G01R 33/5611 |
| | | | | 324/309 |
| 2008/0292167 | A1* | 11/2008 | Todd | G01R 33/4804 |
| | | | | 382/131 |
| 2012/0002854 | A1* | 1/2012 | Khare | G06T 11/006 |
| | | | | 382/131 |
| 2014/0077989 | A1* | 3/2014 | Healy, Jr. | G01S 13/90 |
| | | | | 342/25 F |
| 2016/0341810 | A1* | 11/2016 | Rich | G01R 33/5608 |

OTHER PUBLICATIONS

A.Deshmane, et al.,"Parallel MR Imaging" http://www.ncbi.nlm.nih.gov/pmc/articles/PMC4459721/, Jul. 2012, vol. 36, Issue.1, pp. 55-72.

* cited by examiner

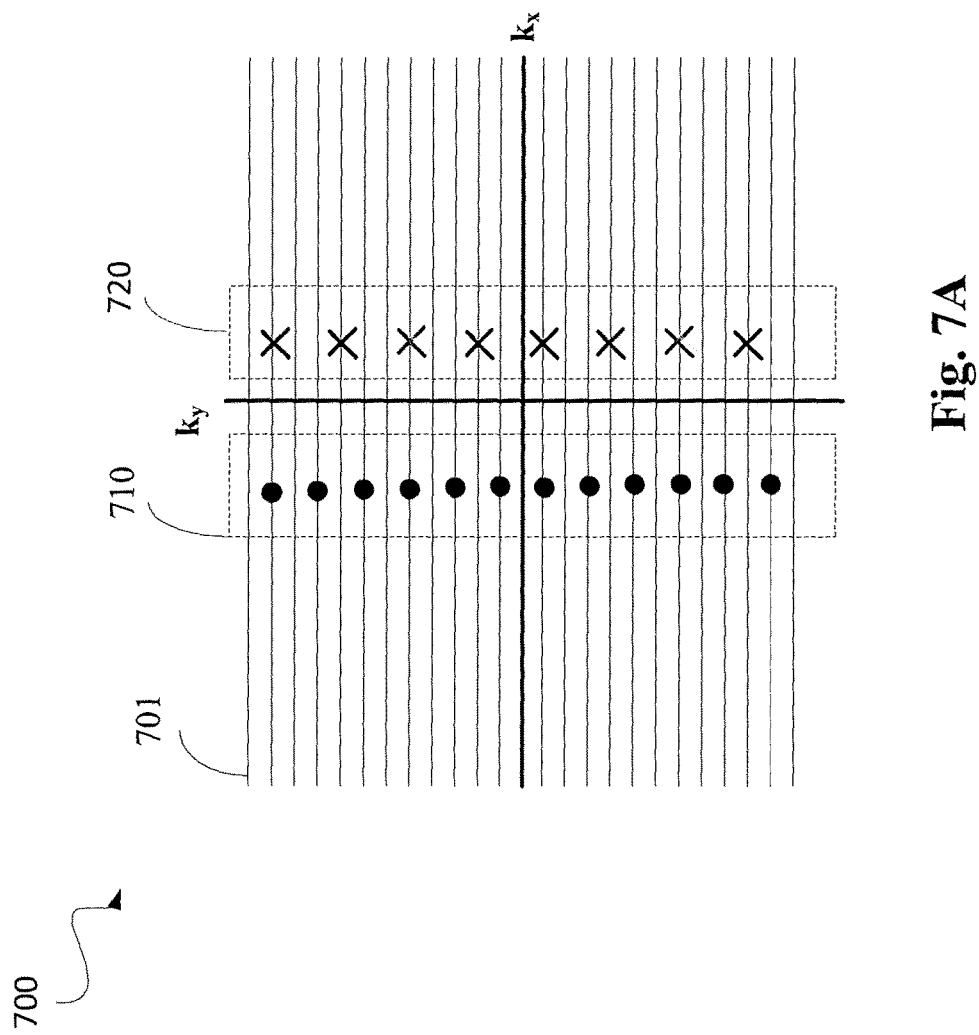

APPARATUS AND METHOD FOR REDUCING ARTIFACTS IN MRI IMAGES

BACKGROUND

Field of Disclosure

The present disclosure relates generally to a technique of reducing artifacts in an MRI data acquisition system.

Description of Related Art

The background description provided herein is for the purpose of generally presenting the context of the disclosure. Work of the presently named inventor, to the extent the work is described in this background section, as well as aspects of the description that may not otherwise qualify as prior art at the time of filing, are neither expressly nor impliedly admitted as prior art against the present disclosure.

In MRI data acquisition systems, a typical method for reducing the MRI acquisition time involves using a faster gradient hardware in conjunction with shorter data-acquisition periods. Parallel acquisition techniques allow for a significant reduction in imaging time by using spatial information that is inherent in a multiple-receiver coil. In such parallel acquisition techniques, multiple phase-encoded data can be derived from actual acquired phase-encoded signals collected in a parallel fashion. However, such parallel acquisition techniques can impose stringent requirements on the measurement of coil sensitivities for spatial harmonic generation. Accordingly, such techniques prove to be cumbersome, inaccurate, or time-consuming, thereby limiting their potential applications.

To address the above limitations, parallel imaging techniques have been developed wherein sampled data can be collected with lesser amounts of data and sparser spacing of the sample locations than normally would be required due to classical Nyquist sampling considerations. In such parallel imaging techniques, the k-space is sampled uniformly at spacings that are increased by a predetermined factor relative to the previously typical Nyquist sampling rates. For instance, in 2D and multi-slice protocols, the sample spacing may be increased in a phase encoding direction by a predetermined factor, maybe an integer greater than one. Typically, increased spacing between acquired sample locations leads to fewer discrete measurement and acquisition steps, which in turn leads to a shorter total acquisition time of an MR imaging procedure. This can be referred to as a higher rate of sampling the needed k-space area. Here, the higher rate is accomplished by means of greater distances in k-space between discretely collected samples, and usually not by means of reduced time differentials between the discrete sampling events.

Equivalently, this higher sampling rate may be described as an under-sampling factor, that is, a ratio of sparser sample spacing in k-space relative to the classical Nyquist sample spacing constraints without parallel imaging methods. In MRI literature, the under-sampling rate is routinely denoted by a value R>1. In a similar manner, 3D-Fourier transform protocols may apply increased spacing in both the phase encoding direction and the slice encoding direction to achieve a higher net rate of acceleration.

However, such parallel imaging techniques are susceptible to diverse systematic measurement error or estimation error resulting in a significant amount of residual artifacts from imperfect removal of image aliases or imperfect synthesis of missing k-space data. Furthermore, such artifacts increase with an increase in the under-sampling rate of the k-space.

Accordingly, there is a requirement for an improved MRI reconstruction method that significantly reduces the artifacts in a reconstructed image while achieving higher sampling rates.

BRIEF DESCRIPTION OF THE DRAWINGS

Various embodiments of this disclosure that are proposed as examples will be described in detail with reference to the following figures, wherein like numerals reference like elements, and wherein:

FIGS. 7A-7C depict, according to an embodiment, other k-space sampling schemes;

DETAILED DESCRIPTION OF EMBODIMENTS

Figure 1:
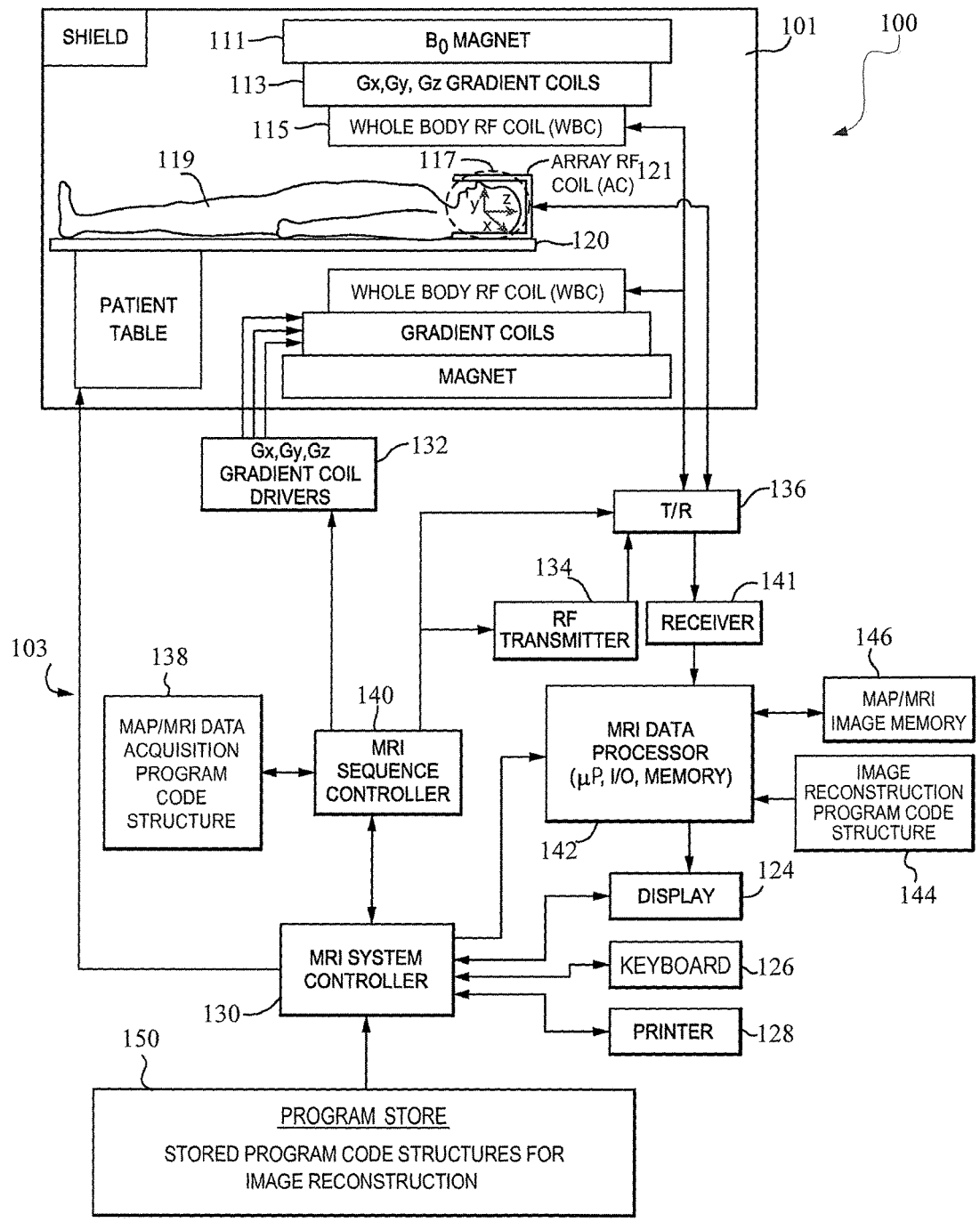
FIG. 1 depicts an exemplary schematic block diagram of an MRI system.

Exemplary embodiments are illustrated in the referenced figures of the drawings. It is intended that the embodiments and figures disclosed herein are to be considered illustrative rather than restrictive. No limitation on the scope of the technology and of the claims that follow is to be imputed to the examples shown in the drawings and discussed herein.

The embodiments are mainly described in terms of particular processes and systems provided in particular implementations. However, the processes and systems will operate effectively in other implementations. Phrases such as 'an embodiment', 'one embodiment', and 'another embodiment' may refer to the same or different embodiments. The embodiments will be described with respect to methods and compositions having certain components. However, the methods and compositions may include more or less components than those shown, and variations in the arrangement and type of the components may be made without departing from the scope of the present disclosure.

The exemplary embodiments are described in the context of methods having certain steps. However, the methods and compositions operate effectively with additional steps and steps in different orders that are not inconsistent with the exemplary embodiments. Thus, the present disclosure is not intended to be limited to the embodiments shown, but is to be accorded the widest scope consistent with the principles and features described herein and as limited only by the appended claims.

Furthermore, where a range of values is provided, it is to be understood that each intervening value between an upper and lower limit of the range—and any other stated or intervening value in that stated range—is encompassed within the disclosure. Where the stated range includes upper and lower limits, ranges excluding either of those limits are also included. Unless expressly stated, the terms used herein are intended to have the plain and ordinary meaning as understood by those of ordinary skill in the art. Any definitions are intended to aid the reader in understanding the present disclosure, but are not intended to vary or otherwise limit the meaning of such terms unless specifically indicated.

An aspect of the present disclosure provides for an apparatus comprising circuitry configured to: acquire a first set of data by under-sampling a first portion of a k-space at a first rate, and acquire a second set of data by under-sampling a second portion of the k-space at a second rate, generate a first intermediate image and a second intermediate image based on the acquired first set of data and the acquired second set of data, respectively, construct a difference image based on the generated first intermediate image and the generated second intermediate image, the difference image including a plurality of artifacts, and reconstruct a final image by selectively combining the first intermediate image with the second intermediate image, the combining being based on identifying, for each artifact of the plurality of artifacts included in the difference image, one of the first intermediate image and the second intermediate image as being a source of the artifact.

An aspect of the present disclosure provides for a method for reducing artifacts in MRI images. The method comprises the steps of acquiring, by circuitry, a first set of data by under-sampling a first portion of a k-space at a first rate, and a second set of data by under-sampling a second portion of the k-space at a second rate, generating a first intermediate image and a second intermediate image based on the acquired first set of data and the acquired second set of data, respectively, constructing by circuitry, a difference image based on the generated first intermediate image and the generated second intermediate image, the difference image including a plurality of artifacts, and reconstructing a final image, by selectively combining the first intermediate image with the second intermediate image, the combining being based on identifying, for each artifact of the plurality of artifacts included in the difference image, one of the first intermediate image and the second intermediate image as being a source of the artifact.

In another embodiment, there is provided a non-transitory computer-readable medium including computer program instructions, which when executed by a computer, causes the computer to perform a method for reducing artifacts in MRI images. The method comprises the steps of acquiring, a first set of data by under-sampling a first portion of a k-space at a first rate, and a second set of data by under-sampling a second portion of the k-space at a second rate, generating a first intermediate image and a second intermediate image based on the acquired first set of data and the acquired second set of data, respectively, constructing a difference image based on the generated first intermediate image and the generated second intermediate image, the difference image including a plurality of artifacts, and reconstructing a final image, by selectively combining the first intermediate image with the second intermediate image, the combining being based on identifying, for each artifact of the plurality of artifacts included in the difference image, one of the first intermediate image and the second intermediate image as being a source of the artifact.

An aspect of the present disclosure provides for an apparatus comprising circuitry configured to construct an edge-map corresponding to a contour of a subject, generate a first intermediate image and a second intermediate image corresponding to a first set of data acquired by under-sampling a first portion of a k-space at a first rate, and a second set of data acquired by under-sampling a second portion of the k-space at a second rate, respectively. The circuitry is further configured to generate a first edge-alias map based on a first set of aliasing distances of the contour of the subject, the first set of aliasing distances being computed based on a field of view and the first rate, generate a second edge-alias map based on a second set of aliasing distances of the contour of the subject, the second set of aliasing distances being computed based on the field of view and the second rate, and reconstruct a final image, by selectively combining the first intermediate image with the second intermediate image, the combining being based on a comparison of the first generated edge-map and the second generated edge-map.

Turning to FIG. 1, there is depicted according to an embodiment, an exemplary magnetic resonance imaging (MRI) system 100. The MRI system 100 depicted in FIG. 1 includes a gantry 101 (shown in a schematic cross-section) and various related system components 103 interfaced therewith. At least the gantry 101 is typically located in a shielded room. The MRI system geometry depicted in FIG. 1 includes a substantially coaxial cylindrical arrangement of the static field $B_0$ magnet 111, a Gx, Gy, and Gz gradient coil set 113, and a large whole-body RF coil (WBC) assembly 115. Along a horizontal axis of this cylindrical array of elements is an imaging volume 117 shown as substantially encompassing the head of a patient 119 supported by a patient table 120.

One or more smaller array RF coils 121 can be more closely coupled to the patient's head (referred to herein, for example, as "scanned object" or "object") in imaging volume 117. As those in the art will appreciate, compared to the WBC (whole-body coil), relatively small coils and/or arrays, such as surface coils or the like, are often customized for particular body parts (e.g., arms, shoulders, elbows, wrists, knees, legs, chest, spine, etc.). Such smaller RF coils are referred to herein as array coils (AC) or phased-array coils (PAC). These can include at least one coil configured to transmit RF signals into the imaging volume, and a plurality of receiver coils configured to receive RF signals from an object, such as the patient's head, in the imaging volume.

The MRI system 100 includes a MRI system controller 130 that has input/output ports connected to a display 124, a keyboard 126, and a printer 128. As will be appreciated, the display 124 may be of the touch-screen variety so that it provides control inputs as well. A mouse or other I/O device(s) can also be provided.

The MRI system controller 130 interfaces with a MRI sequence controller 140, which, in turn, controls the Gx, Gy, and Gz gradient coil drivers 132, as well as the RF transmitter 134, and the transmit/receive switch 136 (if the same RF coil is used for both transmission and reception). The MRI sequence controller 140 includes suitable program code structure 138 for implementing MRI imaging (also known as nuclear magnetic resonance, or NMR, imaging) techniques including parallel imaging. MRI sequence controller 140 can be configured for MR imaging with or without parallel imaging. Moreover, the MRI sequence controller 140 can facilitate one or more preparation scan (pre-scan) sequences, and a scan sequence to obtain a main scan magnetic resonance (MR) image (referred to as a diagnostic image). MR data from pre-scans can be used, for example, to determine sensitivity maps for RF coils 115 and/or 121 (sometimes referred to as coil sensitivity maps or spatial sensitivity maps), and to determine unfolding maps for parallel imaging.

The MRI system components 103 include an RF receiver 141 providing input to data processor 142 so as to create processed image data, which is sent to display 124. The MRI data processor 142 is also configured to access previously generated MR data, images, and/or maps, such as, for example, coil sensitivity maps, parallel image unfolding maps, ghost reduction maps, distortion maps and/or system configuration parameters 146, and MRI image reconstruction program code structures 144 and 150.

In one embodiment, the MRI data processor 142 includes processing circuitry. The processing circuitry can include devices such as an application-specific integrated circuit (ASIC), configurable logic devices (e.g., simple programmable logic devices (SPLDs), complex programmable logic devices (CPLDs), and field programmable gate arrays (FPGAs), and other circuit components that are arranged to perform the functions recited in the present disclosure.

The processor 142 executes one or more sequences of one or more instructions contained in the program code structures 144 and 150. Alternatively, the instructions can be read from another computer-readable medium, such as a hard disk or a removable media drive. One or more processors in a multi-processing arrangement can also be employed to execute the sequences of instructions contained in the program code structures 144 and 150. In alternative embodiments, hard-wired circuitry can be used in place of or in combination with software instructions. Thus, the disclosed embodiments are not limited to any specific combination of hardware circuitry and software.

Additionally, it must be appreciated that the term "computer-readable medium" as used herein refers to any non-transitory medium that participates in providing instructions to the processor 142 for execution. A computer readable medium may take many forms, including, but not limited to, non-volatile media or volatile media. Non-volatile media includes, for example, optical, magnetic disks, and magneto-optical disks, or a removable media drive. Volatile media includes dynamic memory.

Also illustrated in FIG. 1 is a generalized depiction of an MRI system program store (memory) 150, where stored program code structures (e.g., for image reconstruction with reduced or eliminated ghosting artifact, for defining graphical user interfaces and accepting operator inputs to same, etc.) are stored in non-transitory computer-readable storage media accessible to the various data processing components of the MRI system 100. As those in the art will appreciate, the program store 150 may be segmented and directly connected, at least in part, to different ones of the system 103 processing computers having most immediate need for such stored program code structures in their normal operation (i.e., rather than being commonly stored and connected directly to the MRI system controller 130).

Additionally, the MRI system 100 as depicted in FIG. 1 can be utilized to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Furthermore, not only does the physical state of the processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc) generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure, as does a particular structure of computer control program codes that, when sequentially loaded into instruction registers and executed by one or more CPUs of the MRI system 100, causes a particular sequence of operational states to occur and be transitioned through within the MRI system 100.

The exemplary embodiments described below provide for a technique of reducing and/or eliminating parallel imaging artifacts in MRI image reconstruction. Although many of the embodiments described herein are directed to reconstructive mechanisms that employ parallel imaging, the embodiments described herein for eliminating or reducing artifacts are equally applicable to other MR reconstructive techniques.

MRI images are formed by acquiring NMR (nuclear magnetic resonance) RF response signals (e.g. echo data) spatially encoded for respectively corresponding points in k-space. The RF response values are typically generated by "traversing" k-space in two or three dimensions according to a configured MRI pulse sequence. The acquisition of data in the frequency-encoded spatially-encoding direction (e.g., along the x-axis) is typically rapid and on the order of several milliseconds. However, along the phase-encoded axis (e.g., y-axis), a different value of the applied phase-encoding gradient is used to sample each point. Therefore, typically, the acquisition time for an MRI image is largely determined by the number of phase-encoding steps.

Parallel imaging enables the shortening of acquisition time by under-sampling the k-space along the phase-encoding direction. In many parallel imaging techniques, the number of sampled k-space points along the phase-encoding direction is reduced, thereby significantly shortening the acquisition time. Instead of sampling each point along the phase-encoding direction, parallel imaging techniques enable the use of spatial RF transmit/receive patterns, which provide spatially encoded signal strength and coil positioning information inherent in the RF coil(s) (e.g., phased array coils) to reconstruct the MRI image using the samples of fewer selected points along the phase-encoding direction. Further, the reconstructed images based upon parallel imaging may also yield improved spatial resolution.

However, parallel imaging can introduce artifacts, such as reconstruction artifacts, in the output diagnostic images.

Reconstruction artifacts can be primarily due to an unfolding process that is required to obtain the desired diagnostic images based upon the intermediate images that are acquired by under-sampling (in effect reducing the field of view) in the phase-encoding direction. "Unfolding" is defined herein as the process of combining multiple aliased images in order to generate a desired un-aliased diagnostic image. Often, the multiple aliased images vary from each other, in that each was collected from different RF receive coils.

Accordingly, embodiments described herein provide a mechanism of under-sampling and processing regions of the k-space to acquire a reconstructed image that is substantially free of artifacts.

Figure 2:
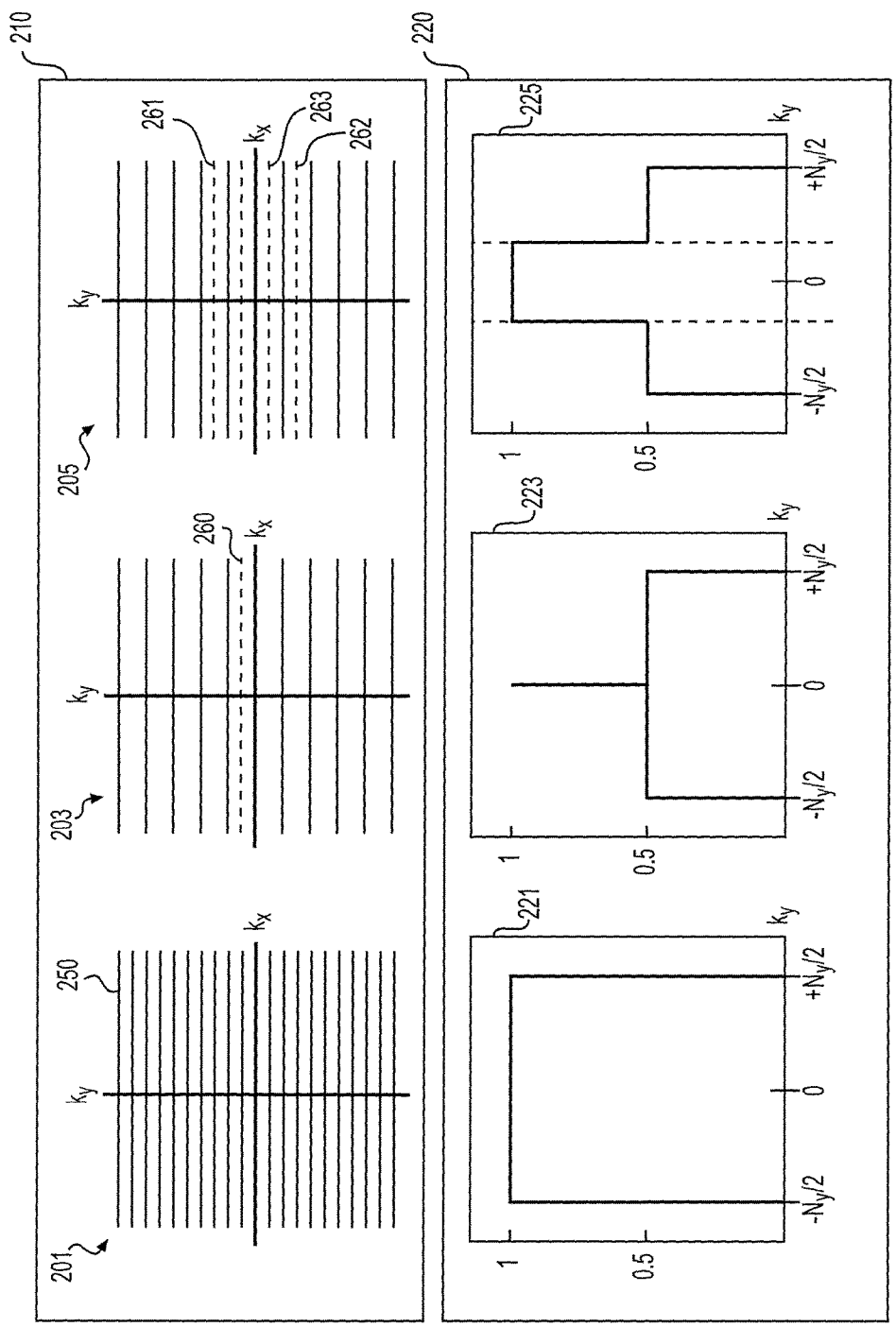
FIG. 2 depicts exemplary k-space sampling schemes and corresponding density functions.

FIG. 2 depicts exemplary k-space sampling schemes. In FIG. 2, three different sampling schemes 210 are depicted along with their corresponding density functions 220. A sampling scheme for a reference scan is depicted as 201, wherein each line 250 of the k-space is sampled. Such a sampling scheme has a uniform density function 221.

In FIG. 2, the sampling scheme depicted in 203 corresponds to an under-sampling scheme having a data-reduction factor of two. The data-reduction factor of an under-sampling scheme (also referred to herein as an under-sampling rate) indicates a number of lines in the k-space that are sampled. For instance, a data-reduction factor of two (or alternatively, an under-sampling rate of two) indicates that one of every two lines of the k-space is sampled. Moreover, the sampling scheme 203 also includes an additional auto-calibration signal (ACS) line 260. The density function 223 corresponds to the sampling scheme 203.

Further, the sampling scheme 205 is similar to the sampling scheme of 203, with the addition of three extra ACS lines (261-263), which lie in a central portion of the k-space. The density function corresponding to the sampling scheme 205 is represented as 225.

Figure 3A:
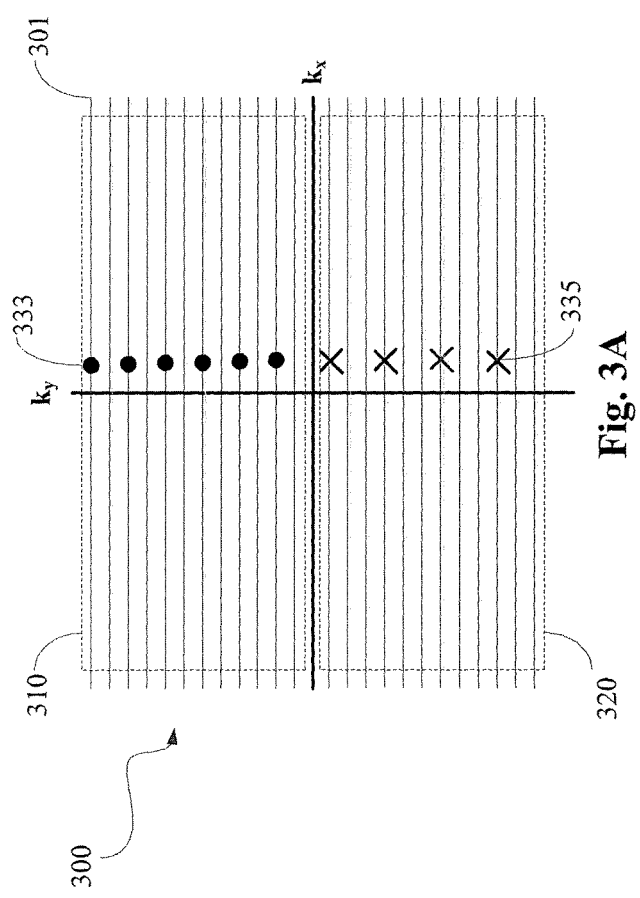
FIG. 3A depicts, according to an embodiment, a k-space sampling scheme.

Turning to FIG. 3A, there is depicted according to an embodiment, an illustration of an under-sampling scheme 300 of the k-space. In FIG. 3A, the horizontal axis ($k_x$) and the vertical axis ($k_y$), represent respectively, the frequency-encoding and phase-encoding directions, suitable for MR 2D imaging of some slice.

As shown in FIG. 3A, a first portion 310 of the k-space corresponds to the region of the k-space along the positive phase encoding direction. The first portion 310 is under-sampled with a first data reduction factor. For instance, as shown in FIG. 3A, the portion 310 of the k-space is under-sampled with a data reduction factor of two. Accordingly, alternate data acquisition lines 301 of the region 310 of the k-space are sampled, wherein each sampled line is represented by a dark circle 333.

Figure 3B:
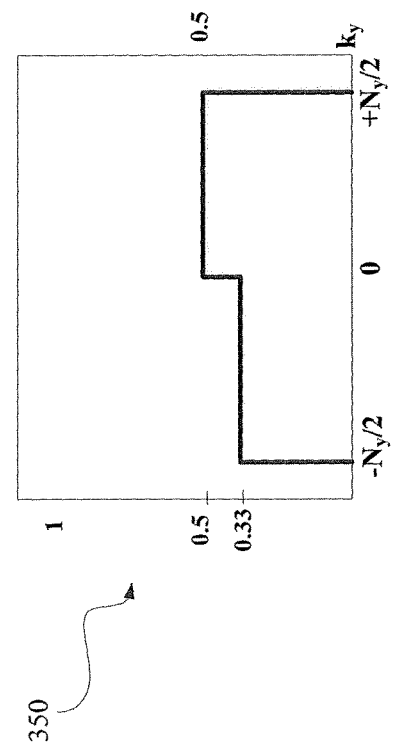
FIG. 3B depicts, according to an embodiment, a density function corresponding to the sampling scheme of FIG. 3A.

Further, a second portion of the k-space (e.g., the region of the k-space along the negative phase encoding direction) is under-sampled with a second data reduction factor, wherein the second data reduction factor is different than the first data reduction factor. For example, as shown in FIG. 3A, the portion 320 of the k-space is under-sampled with a data reduction factor of three. Accordingly, every third data acquisition line 301 of the region 320 of the k-space is sampled. The sampled lines of the region 320 of the k-space are represented by a cross mark 335. The density function 350 corresponding to the under-sampling scheme of FIG. 3A is depicted in FIG. 3B. The density function 350 is a step function corresponding to the different data-reduction factors that are used to under-sample the first portion and the second portion of the k-space, respectively.

Referring to the under-sampling scheme as depicted in FIG. 3A, and denoting the under-sampling rate of the first portion as $R_{upper}$, and the under-sampling rate of the second portion as $R_{lower}$, an overall data acquisition time ($T_{total}$) can be represented as a summation of the data acquisition times of the first and second portions, respectively. Specifically, the overall acquisition time can be computed as follows:

$$T_{total} = T_{R_{upper}} + T_{R_{lower}} \quad (1)$$

$$= 0.5 * T_{normal} * \left( \frac{1}{R_{upper}} + \frac{1}{R_{lower}} \right) \quad (2)$$

where $T_{normal}$ corresponds to the time required to acquire the data when the entire k-space is sampled with a single sampling rate. For values of $R_{upper}=2$ and $R_{lower}=3$, the overall data acquisition time is equal to $T_{normal}/2.4$.

Additionally, an effective total sampling rate denoted as $R_{eff}$ (also referred to herein as a total acceleration rate) can be computed (for the case of not including the partial Fourier transform) as follows:

$$\frac{1}{R_{eff}} = \frac{1}{R_{upper}} + \frac{1}{R_{lower}} \quad (3)$$

and, for the case of including the partial Fourier transform as:

$$\frac{1}{R_{eff}} = \frac{0.5}{R_{upper}} + \frac{0.5}{R_{lower}} \quad (4)$$

Furthermore, it must be appreciated that the first portion and the second portion as depicted in FIG. 3A are in no way restricted to correspond to the regions of the k-space that lie along the positive and negative directions of the phase encoding axis, respectively. Rather, the first portion and the second portions could correspond to any region of the k-space. Moreover, the first portion need not be equal in size to the second portion. Additionally, the first portion and the second portion can be distinct, or can have an overlapping region. Exemplary techniques of partitioning the k-space are described later with reference to FIGS. 7A to 7C.

Figure 4:
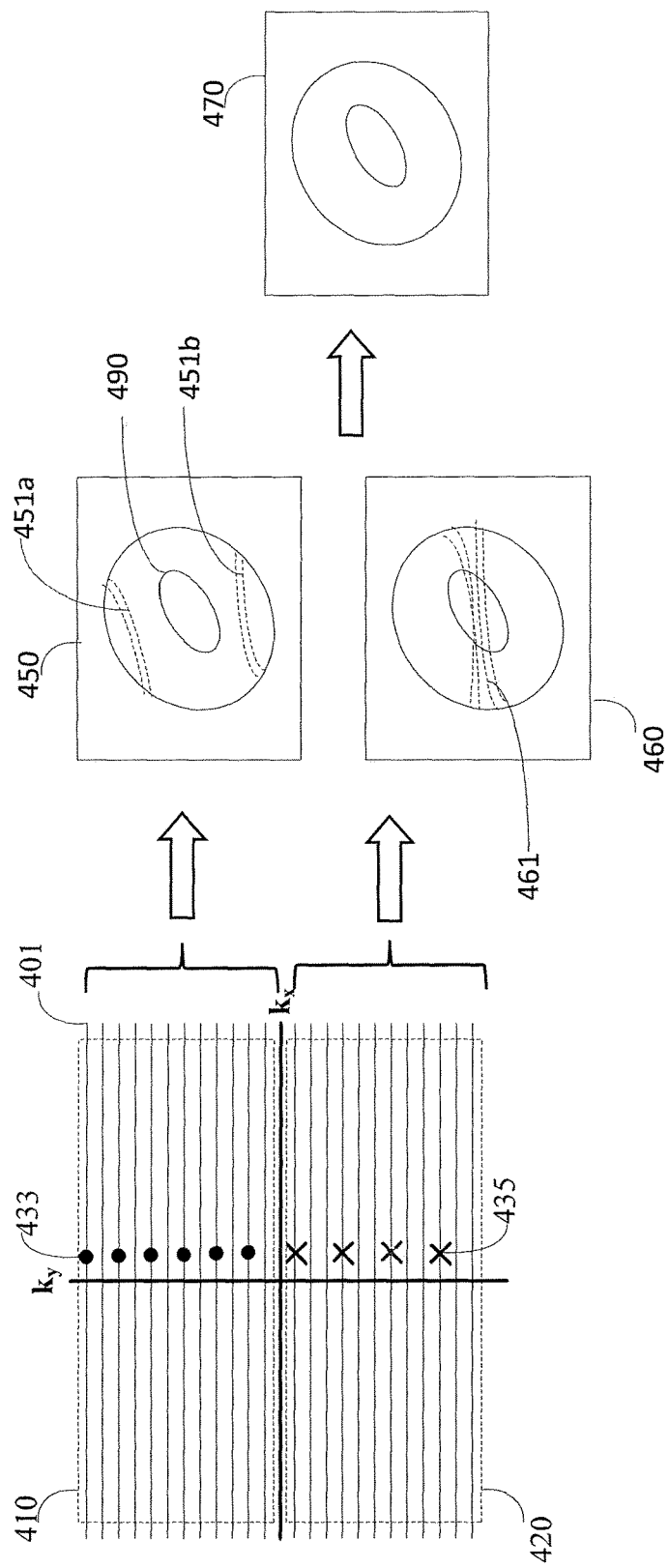
FIG. 4 illustrates, according to an embodiment, an exemplary technique of generating an artifact-free image.

FIG. 4 illustrates according to an embodiment, an exemplary technique of generating an artifact-free image. As shown in FIG. 4, a first portion 410 of the k-space (i.e., region of the k-space lying along the positive phase encoding direction) is under-sampled with a first data reduction factor (e.g., $R_{upper}=2$). A second portion 420 of the k-space (i.e., the region of the k-space along the negative phase encoding direction) is under-sampled with a second data reduction factor (e.g., $R_{lower}=3$). The data acquisition lines 401 of the k-space that are sampled in each of the first portion 410, and the second portion 420 are depicted by darkened circles 433 and by cross-marks 435, respectively.

The sampled data from each under-sampled portion 410 and 420 of the k-space is processed to reconstruct a first intermediate image 450, and a second intermediate image 460, respectively. Basic parallel imaging techniques, perhaps along with reconstruction methods such as partial-Fourier processing, projections onto convex sets (POCS), the homodyne method, and the like can be utilized to generate the first intermediate image 450, and the second intermediate image 460, respectively.

It must be appreciated that the first under-sampling rate (i.e., the data reduction factor) is different than the second under-sampling rate. As a result, artifacts in the first intermediate image and the second intermediate images are located at different spatial locations. Specifically, as shown in FIG. 4, the intermediate image 450 includes a subject 490, and can include artifacts 451a and 451b located at the top and bottom portions of the generated image 450, whereas the intermediate image 460 has artifacts 461 located substantially in the middle of the image. Thus, by one embodiment, the feature of obtaining artifacts in the intermediate images at different spatial locations is exploited to generate a final image 470 that is substantially free of artifacts.

Figure 5A:
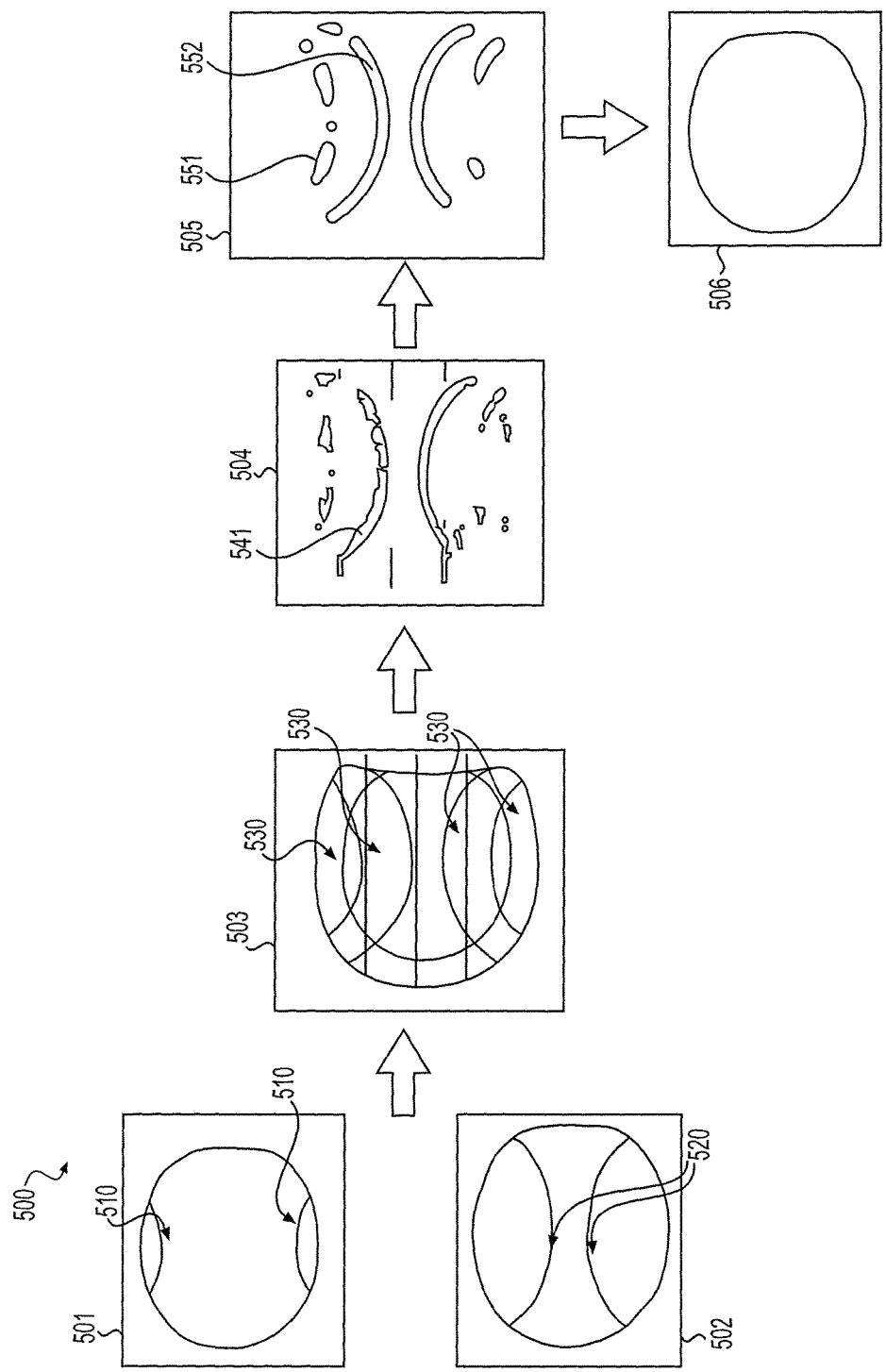
FIG. 5A illustrates an exemplary flow diagram illustrating the generation of an artifact-free image in one embodiment.

Described next with reference to FIG. 5A, is a technique that enables the determination of which one of the first intermediate image and the second intermediate image includes an artifact at a specific location. Further, the technique selectively combines (i.e., merges) the two intermediate images to obtain the final image that is substantially artifact-free.

FIG. 5A illustrates an exemplary flow diagram 500 illustrating the generation of an artifact-free image by one embodiment.

In FIG. 5A, the first intermediate image, and the second intermediate image are depicted as 501 and 502, respectively. The locations of artifacts in each of the intermediate images are depicted at positions 510 and 520, respectively.

According to one embodiment, a difference image 503 is computed based on the first and second intermediate images. Specifically, a pixel score for each pixel of the difference image 503 is computed as the absolute value of the difference in pixel values of corresponding pixels in the first intermediate image and the second intermediate image. In the difference image 503, the locations depicted by 530 correspond to the pixel locations, wherein the computed difference value is significant.

Specifically, based on a predetermined threshold value, a masked image 504 is computed, wherein the portions of the masked image 504, where the computed pixel value difference (of the corresponding pixels of the first and second intermediate images) is greater than the predetermined threshold value are denoted as 541. The portions denoted as 541 reflect artifacts at their respective positions. Note that each of the artifacts in the masked image is obtained from exactly one of the first intermediate image and the second intermediate image. Specifically, as stated previously, due to the spatial difference in the location of the artifacts in the intermediate images, it can be assumed that an artifact location in the difference image occurs due to an artifact in one of the two intermediate images. In other words, for a given artifact location in the difference image, a corresponding location in one of the two intermediate images can be deemed as being 'correct' (i.e., artifact-free), and the location in the other intermediate image as being the source of the artifact.

By one embodiment, the masked image 504 is processed to generate a gray-scale image 505 that depicts relative artifact levels of the first intermediate image 501 and the second intermediate image 502. Specifically, the gray scale image 505 depicts artifacts from both the first intermediate image 501 and the second intermediate image 502. In the image 505, the region locations (depicted by white shading) 551 correspond to artifacts that emerge from the first intermediate image, whereas the locations depicted by the darkened black regions 552, correspond to artifacts that emerge from the second intermediate image. Regions where neither the first intermediate image, nor the second intermediate image clearly demonstrate artifacts by subtraction appear as intermediate gray level pixels in the gray scale image 505.

Upon each artifact in the masked image 504 being categorized as an artifact that occurs due to one of the first intermediate image 501 and the second intermediate image 502, a final image 506 that is substantially free of artifacts is generated based on selectively combining the first intermediate image 501 and the second intermediate image 502.

Figure 5B:
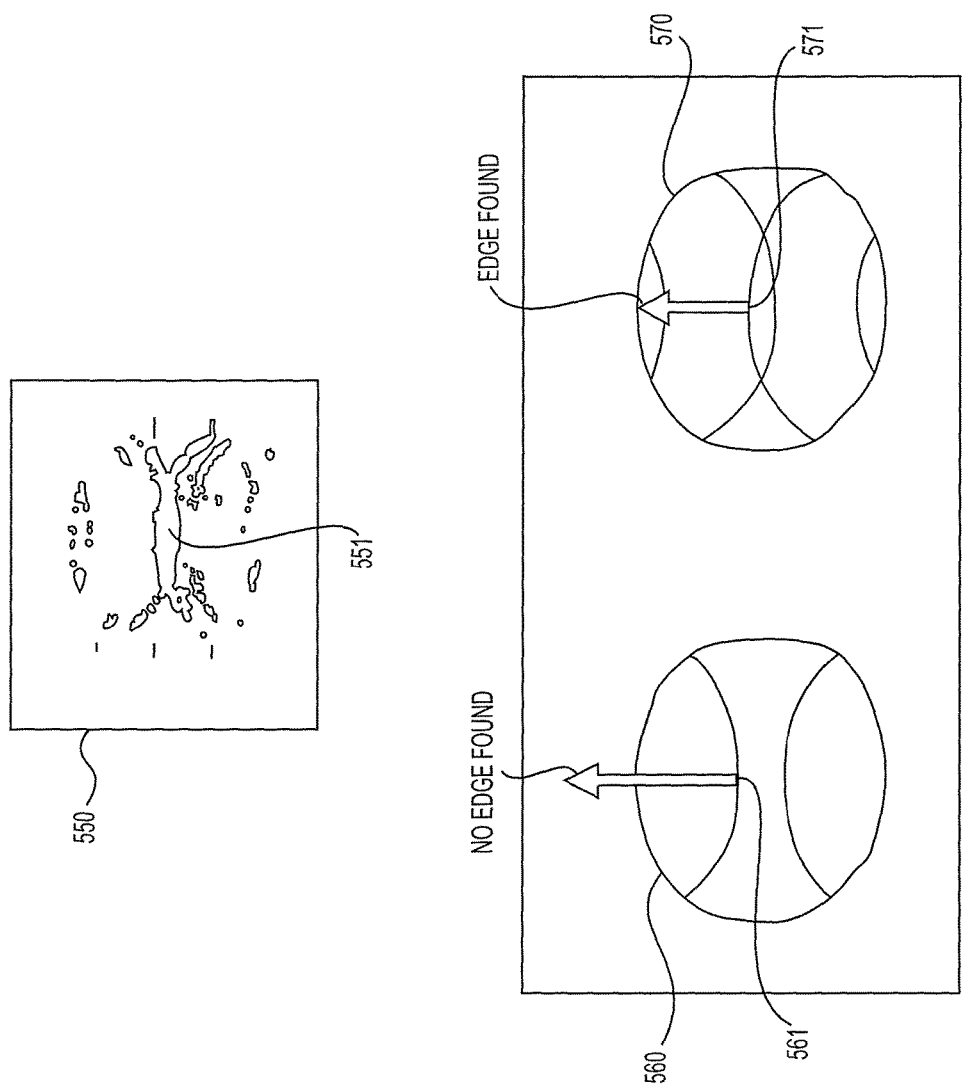
FIG. 5B illustrates, according to an embodiment, a technique of identifying a source of an artifact.

FIG. 5B illustrates a technique of identifying, for each artifact in the difference image 503, one of the first intermediate image 501 and the second intermediate image 502, as being a source of the artifact. Furthermore, FIG. 5B illustrates a technique of combining the intermediate images to obtain a final artifact-free image.

FIG. 5B depicts a difference image 550 that includes artifacts denoted by whitened portions. For each artifact in the difference image, one must determine whether the first intermediate image or the second intermediate image is the source of the artifact.

In one embodiment, for a given location of an artifact in the difference image, the existence of edge content and/or presence of a high-order spatial derivative, at aliasing distances of $\pm n*(1/R_a)*FOV$, and $\pm n*(1/R_b)*FOV$ respectively, is determined in the first and second intermediate images. Note that $R_a$ and $R_b$ correspond to the first and the second under-sampling rates of respective k-space portions, FOV corresponds to the field of view, and n corresponds to a positive integer. For example, consider the artifact location depicted by 551 in the difference image. Further, a determination of the existence of edge content, at aliasing distances of $\pm n*(1/R_a)*FOV$, starting from location 561, which corresponds to the location of the artifact 561 in the difference image, is performed on the first intermediate image 560.

In a similar manner, the existence of edge content (at aliasing distances $\pm n*(1/R_b)*FOV$), starting from location 571, which corresponds to the location of the artifact 561 in the difference image, is performed on the second intermediate image 570. In the example as depicted in FIG. 5B, an edge is detected in the second intermediate image 570, and no edge is detected in the first intermediate image 560. Accordingly, it is deduced that the second intermediate image is a likely source of the artifact (denoted by 551) in the difference image 550.

Upon determining a source for each artifact in the difference image, a final image can be generated based on selectively combining the first and the second intermediate images. In one embodiment, the selective combination is performed as follows: for a pixel in the difference image that corresponds to the location of an artifact (i.e., the computed difference in the corresponding pixel values of the pixels of the intermediate images is greater than the predetermined threshold), the corresponding pixel in the final image is assigned the pixel value of the pixel of the intermediate image that is determined as not being the source of the artifact. For instance, referring to FIG. 5B, the pixel at location 551 corresponds to a location of an artifact in the difference image 550. As described above, the second intermediate image 570 is determined as being the source (due to presence of a detected edge) of the artifact at location 551 in the difference image. Accordingly, in the generation of the final image, the pixel corresponding to location 551 in the final image is assigned the pixel value of the pixel at location 561 in the first intermediate image.

Further, for pixels in the difference image that do not correspond to the location of an artifact (due to the computed difference in the corresponding pixel values of the pixels of the intermediate images being smaller than the predetermined threshold), the corresponding pixel in the final image is assigned a pixel value that is a weighted combination of the pixel values of the corresponding pixels in the first and second intermediate images. In one embodiment, a 'g-value map' (i.e., a geometry factor value map) is computed for each of the first and the second intermediate images. The g-value map for an intermediate image indicates a noise level of each pixel of the intermediate image. Accordingly, in one embodiment, the weighted combination of the pixel values of the pixels in the first and second intermediate images can be based on the corresponding g-values of the pixels of the first and the second intermediate images. Note that the g-value map for an intermediate image may be constructed by the technique as described by Pruessmann K. P., et al, in "SENSE: Sensitivity Encoding for Fast MRI," Magn. Reson. Med., 42:952-962, 1999, the contents of which are incorporated herein by reference in its entirety.

Figure 6:
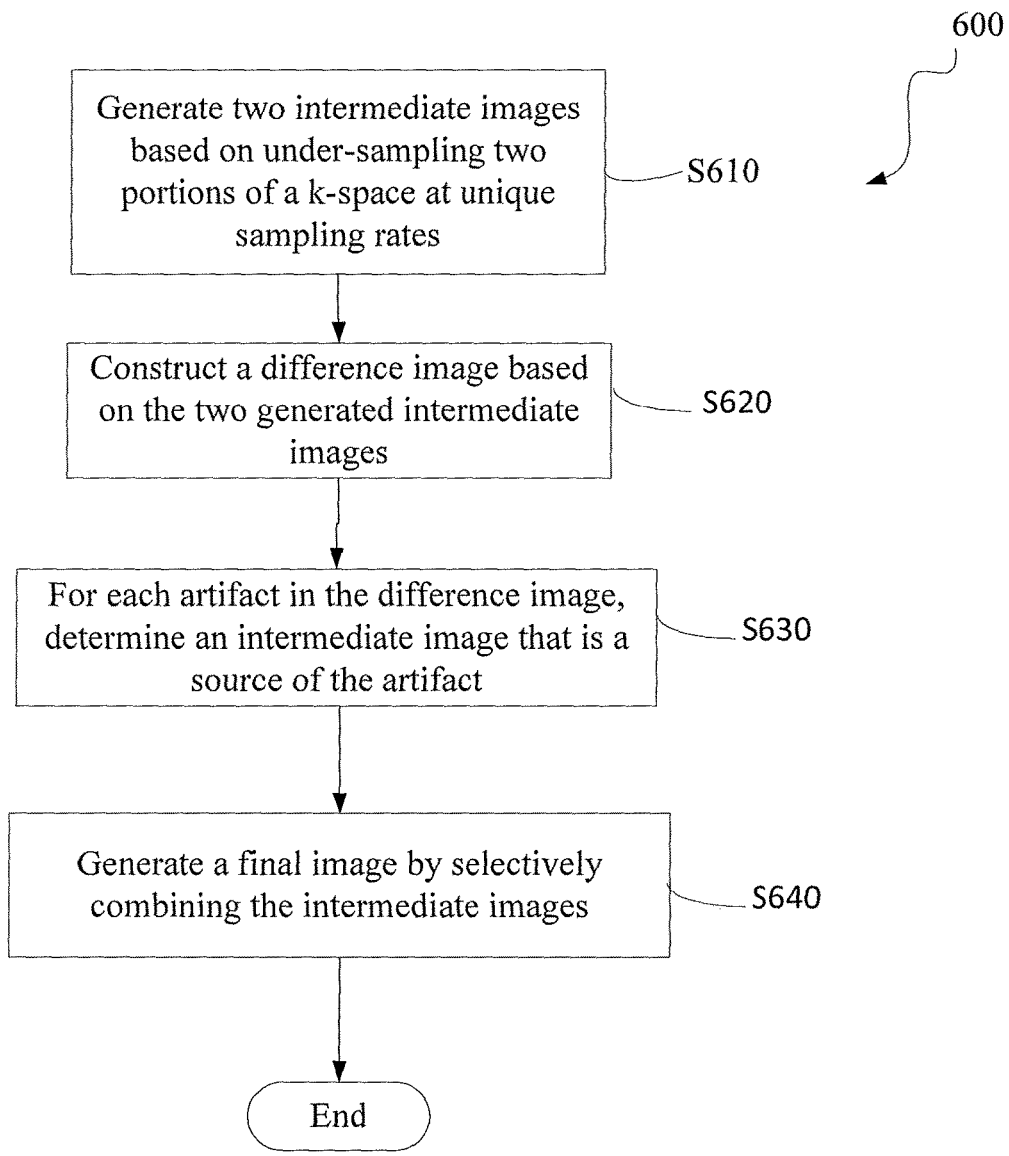
FIG. 6 depicts, according to an embodiment, an exemplary flowchart illustrating the steps performed in reducing artifacts in image reconstruction.

Turning to FIG. 6 there is depicted according to an embodiment, an exemplary flowchart 600 illustrating the steps performed in reducing artifacts in image reconstruction.

The process commences in step S610, wherein two portions of a k-space are under-sampled at unique sampling rates (i.e., data reduction factors). For each under-sampled portion of the k-space, a corresponding intermediate image is generated. Note that the intermediate images can be generated by parallel imaging techniques perhaps along with such techniques as partial-Fourier processing, projections onto convex sets (POCS), or the homodyne method, etc.

In step S620, a difference image is constructed based on the generated intermediate images. For instance, the difference image can be constructed by computing a difference in pixel values of corresponding pixels of the intermediate images. As described previously, when the computed difference in the pixel values of the intermediate images exceeds a predetermined threshold, the pixel location is identified as including an artifact.

Further, in step S630, the process identifies, for each artifact in the difference image, one of the generated intermediate images as being a source of the artifact. The intermediate image that is a source of an artifact can be identified based on the existence of an edge in the intermediate image, as described previously with respect to FIG. 5B.

Upon identifying a source for each artifact in the difference image, the process moves to step S640, wherein a final image is generated by selectively combining the intermediate images. Specifically, as stated previously, for a pixel in the difference image that corresponds to the location of an artifact, the corresponding pixel in the final image is assigned the pixel value of the pixel of the intermediate image that is determined as not being the source of the artifact. Moreover, for a pixel in the difference image that does not correspond to the location of an artifact, the corresponding pixel in the final image is assigned a value that is a weighted combination of the pixel values of the corresponding pixels in the intermediate images. Upon generating the final image, the process of FIG. 6 terminates.

FIG. 7A depicts, according to an embodiment, another k-space under-sampling scheme 700. As shown in FIG. 7A, the entire k-space is sampled twice using two data-reduction factors, respectively. Specifically, the entire k-space is first sampled using a first data-reduction factor, for example, a data-reduction factor of two. The lines 701 of the k-space that are sampled by the first under-sampling scheme are represented by darkened circles included in a dotted box 710.

In a similar manner, the k-space is further sampled using a second data-reduction factor, for example, a data-reduction factor of three. The lines 701 of the k-space that are sampled by the second under-sampling scheme are indicated by cross marks included in a dotted box 720. It must be noted that by sampling the entire k-space with two data-reduction factors will lead to some k-space lines being utilized twice (i.e., the two under-sampling schemes will share a subset of lines of the k-space). Utilizing a line twice in reconstructions does not, however, require that the line is actually acquired twice. Acquiring lines common to both under-sampling schemes only once results in less total data acquisition, and faster MRI scan times. Furthermore each of the two under-sampling schemes can be used to generate a corresponding intermediate image, as described previously with respect to FIG. 4. The two intermediate images can be selectively combined, as stated previously, in order to generate a final image that is substantially free of artifacts.

Figure 7B:
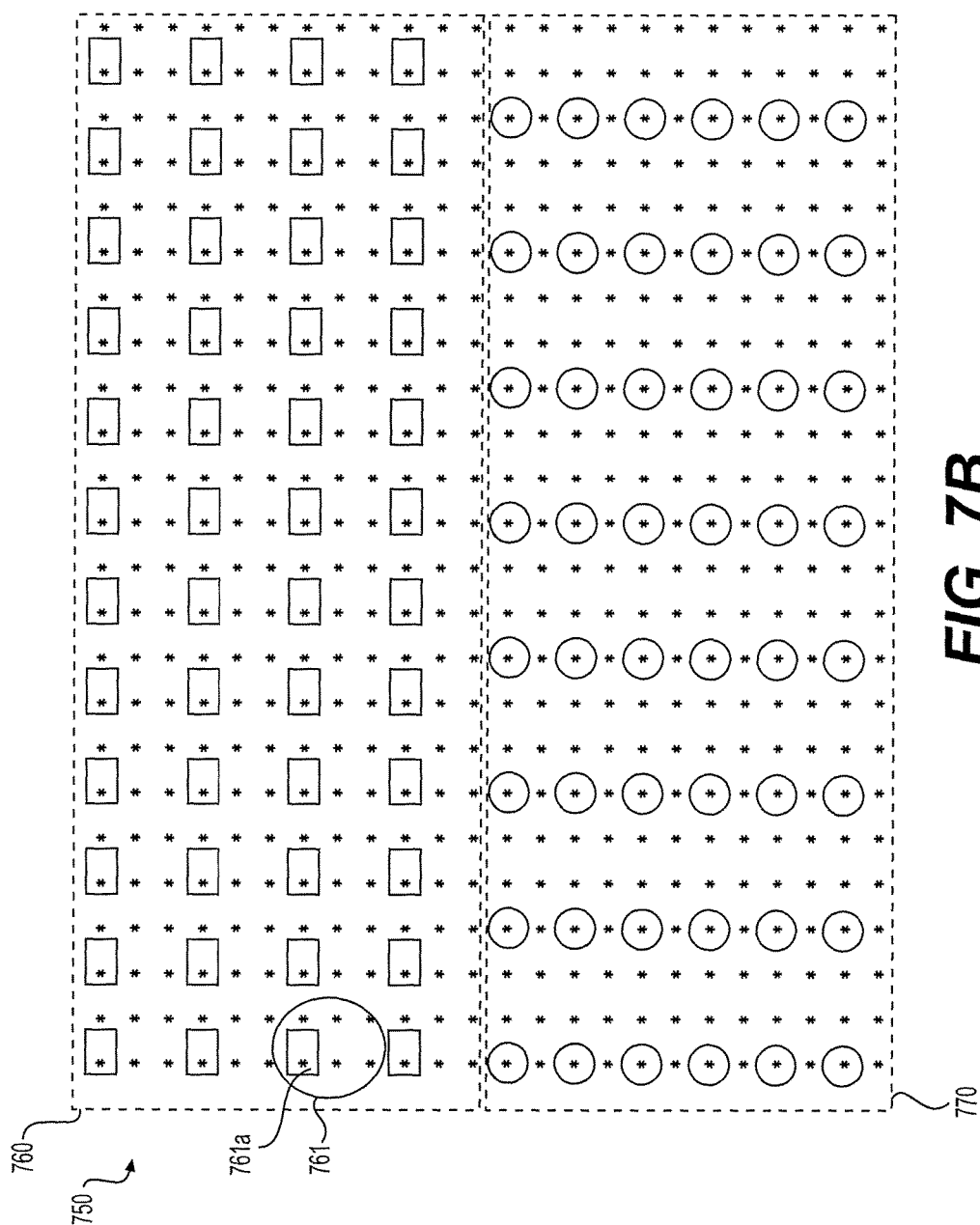

FIG. 7B illustrates, according to an embodiment, a two-dimensional phase encoding sampling scheme 750. The two axes shown are the two axes of a 3D volume scan which utilize phase encoding, the axes being the primary phase encoding axis, and the secondary phase encoding axis. Commonly, the secondary phase encoding axis corresponds to the axis of transmit RF slice selection. In FIG. 7B, and subsequent FIG. 7C, the frequency encode axis of k-space is not depicted. The frequency encode axis could be considered as "coming out of the page", or the FIGS. 7B and 7C could be drawn as three-dimensional blocks of k-space if needed, but for simplicity in these figures the third axis is simply ignored.

Specifically, the two-dimensional sampling scheme corresponds to a scenario wherein the k-space is under-sampled in both the horizontal direction as well as the vertical direction. The k-space is under-sampled in the horizontal direction with a first data-reduction factor (A) and is under-sampled in the vertical direction with a second data-reduction factor (B). Thus, the sampling data-reduction factor for a particular region of the k-space can be denoted as 'A'×'B', (where A and B can be any positive numbers).

In one embodiment, the k-space is partitioned into two portions represented as 760 and 770, respectively. Each of the two portions of the k-space is under-sampled with a unique data-reduction factor. For instance, the region 760 is under-sampled with a first data-reduction factor of '2×3'. Note that the data-reduction factors in the horizontal direction and the vertical directions indicate a number of spacing incurred in the horizontal and vertical directions, respectively. Specifically, for a group of six data points 761 of region 760, one of every two data points is sampled in the horizontal direction, and one of every three data points is sampled in the vertical direction. Thus, for the group of six data points 761, only a single data point 761a is acquired. The acquired data points of the region 760 are depicted by darkened rectangles.

In a similar fashion, the region 770 is under-sampled at a rate of '3×2'. The acquired data points of the region 770 are depicted by darkened circles. The sampling technique as described above can be applied in a 3D-Fourier transform (3DFT) protocol, wherein the two regions 760 and 770 can correspond to the opposite sides of the 3DFT k-space.

Figure 7C:
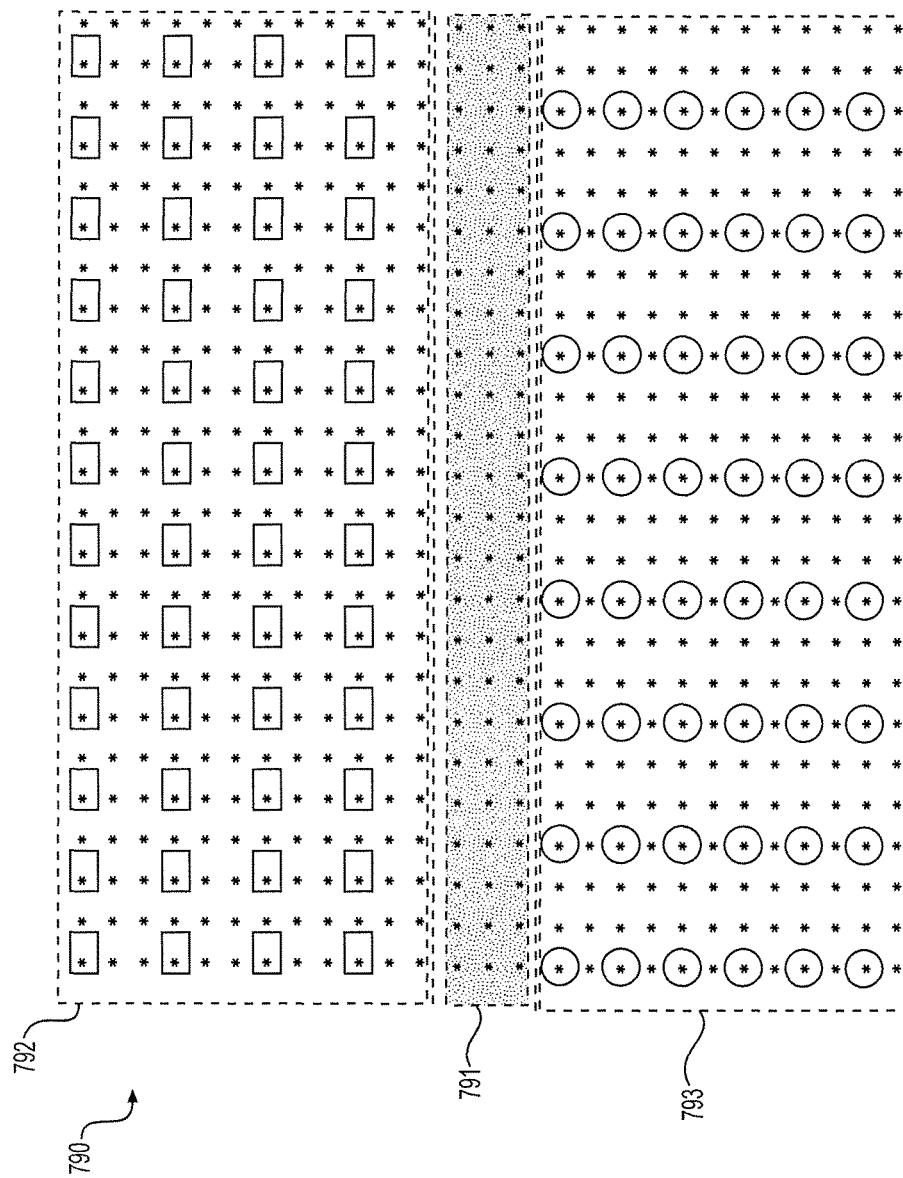

Furthermore, it must be appreciated that the two under-sampling rates 'A×B' corresponding to the two regions of the k-space can take any other unique values. Moreover, the k-space can be partitioned into more than two regions, wherein each region is under-sampled at a unique under-sampling rate. For example, FIG. 7C depicts, according to one embodiment, another two-dimensional sampling scheme 790. In the sampling scheme as depicted in FIG. 7C, a central region of the k-space 791 is fully sampled. Further, the regions 792 and 793 are under-sampled in a manner similar to that of regions 760 and 770 of FIG. 7B.

Figure 8:
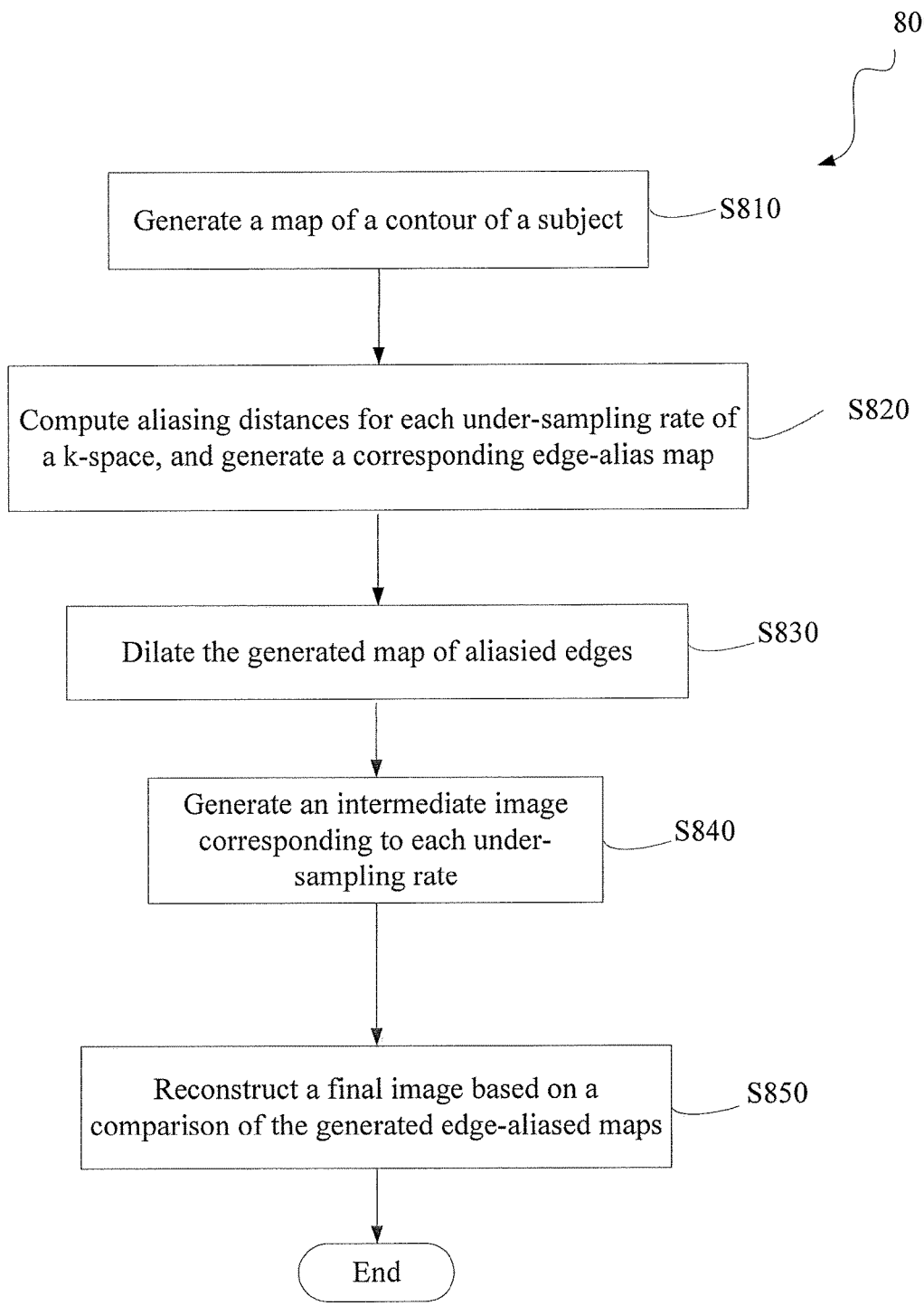
FIG. 8 depicts, according to an embodiment, another exemplary flowchart illustrating the steps performed in reducing artifacts in image reconstruction.

FIG. 8 depicts according to an embodiment, an exemplary flowchart 800, illustrating the steps performed in reducing artifacts in MRI image reconstruction.

The process 800 commences in step S810, wherein a map (i.e., an image) of a contour of a subject is generated. In one embodiment, the contour map (also referred to herein as an edge-map) can be generated based on a pre-scanned image, which is obtained either via a scan performed using the whole body coil (i.e., coil 115 in FIG. 1), or the array of individual coils (i.e., coils 121 in FIG. 1) included in the MRI system 100.

Further, a masking process can be performed on the pre-scanned image, which generates a 'region of support', i.e., provides an area (air-body interface) from where the MRI signal originates. The masking process can be implemented so as to provide a 'binary image 3D representation', over a stack of 2D images that make up the 3D volume. The 3D volume can be a spatial reformatting of the native pixel locations of a pre-scan that is interpolated and resampled to match the pixel locations of the main 3D parallel imaging scan. Moreover, in one embodiment, the masked image can be improved by performing morphological operations such as 'hole filling' in order to improve the masked image, such that its structure corresponds closely to being the shape of the body of the subject. In such a manner, nominal edges between the air-body interface can be detected to generate the contour map.

Further, the process moves to step S820, wherein an edge-alias map corresponding to each under-sampling rate of the k-space is generated. For instance, consider that a first portion of the k-space (e.g., a portion lying along the positive phase encoding direction) is sampled at a first data reduction rate (i.e., under-sampling rate), and a second portion of the k-space (e.g., portion lying along the negative phase encoding direction) is sampled at a second data reduction rate. Accordingly, in step S820, based on the generated edge-map (in step S810), a first edge-alias map is generated corresponding to the first data reduction rate, and a second edge-alias map is generated corresponding to the second data reduction rate.

According to one embodiment, the first edge-alias map and the second edge-alias map are generated based on a first set of aliasing distances of the contour of the subject, and a second set of aliasing distances of the contour of the subject, respectively. Note that aliasing distances correspond to spatial distances, which indicate how far aliased pixels are located from primary un-aliased pixels. Further, the first set of aliasing distances and the second set of aliasing distances are computed based on the technique of under-sampling the first portion and the second portion of the k-space, respectively.

For instance, consider the scenario where under-sampling is performed only along the $k_y$-axis, with the first data reduction factor of $R_a$ for the first portion, and the second data reduction factor of $R_b$ for the second portion, as shown in FIG. 3A. For values of $R_a=3$, and $R_b=4$, and a FOV=240 pixels along the y-axis, the aliases are offset in the y-axis direction by distances of $n*(FOV/R_a)$ where n is an integer: $-2, -1, 1, 2$, corresponding to the $R_a=3$ under-sampling pattern, and by distances of $m*(FOV/R_b)$ where m takes on values such as $-3, -2, -1, 1, 2, 3$, corresponding to the $R_b=4$ under-sampling pattern. The corresponding first set of aliasing distances is: { . . . , +160, +80, −80, −160 . . . } pixels and the second set of aliasing distances is { . . . 180, 120, 60, −60, −120, −180 . . . } pixels.

Figure 9:
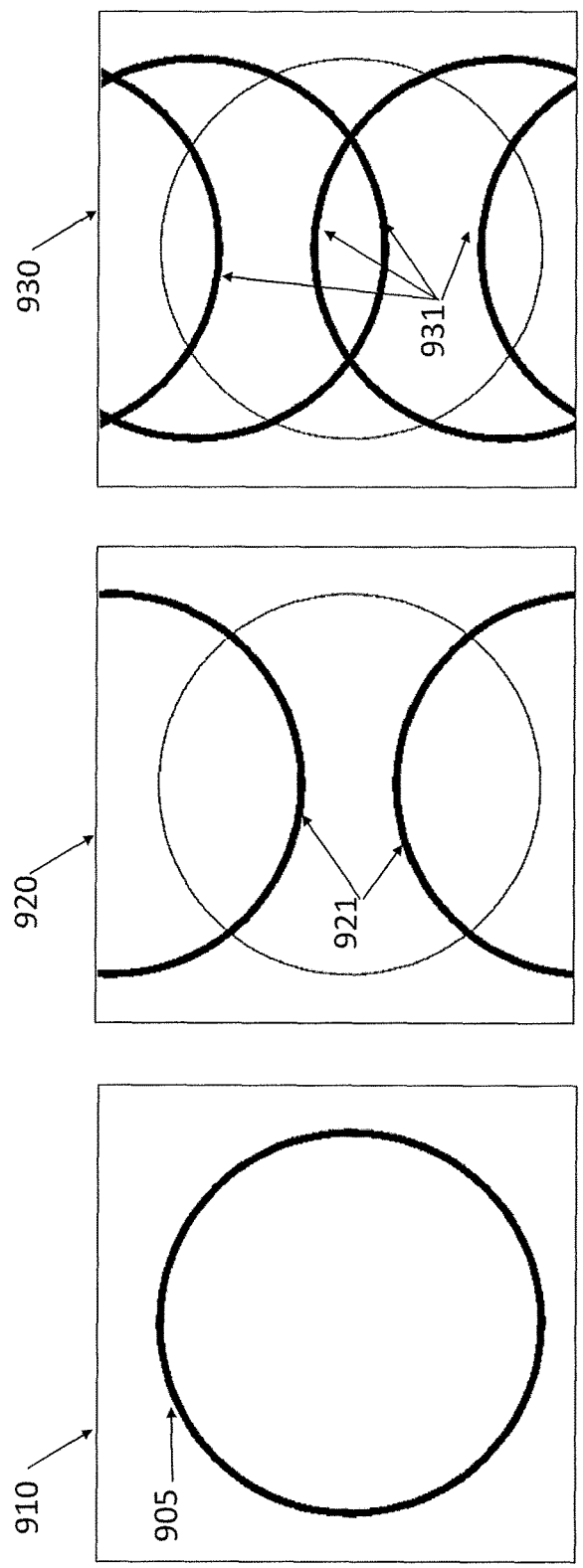
FIG. 9 depicts an exemplary edge map and a corresponding first edge-alias map and a second edge-alias map.

Upon computing the first set of aliasing distances, a first edge-alias map is generated to include shifted edge locations (i.e., superimposed aliased locations for the computed shifts). Note that the process of generating an edge-alias map is a convolution process, which corresponds to super-positioning of all the edges of the contour of the subject that are offset by the aliasing distances. In a similar fashion, a second edge-alias map can be generated. For instance, FIG. 9 depicts an exemplary edge-map and a corresponding first edge-alias map and a second edge-alias map. In FIG. 9, image 910 corresponds to the contour image (edge-map) depicting the edges of a subject 905. Further, images 920 and 930 depict the first edge-alias map and the second edge-alias map that are generated for each under-sampling pattern (e.g., two under-sampling patterns of the k-space). In images 920 and 930, the lines depicted by 921 and 931 respectively correspond to the shifted edges that are computed based on the first set of aliasing distances and the second set of aliasing distances, respectively.

Turning back to FIG. 8, the process proceeds to step S830, wherein a dilation operation is performed on each of the edge-alias maps that are generated in step S820. The dilation operation provides for a way to obtain a width of the shifted edges to be comparable to the width of the artifacts. It must be appreciated that the dilation of the edge-aliased maps represents locations where parallel imaging artifacts are likely to be found. In one embodiment, a reasonable criterion for the width of the dilation operation, is to dilate by a distance which is the nominal resolution distance of coil sensitivity maps. Resolution of coil sensitivity maps may be deduced from the acquisition details of a coil map prescan acquisition and from processing details such as smoothing filters applied in the map generation processing. In another embodiment, an alternate reasonable criterion for the amount of dilation is to select a distance sufficient to span typical physiological motion ranges, for example a typical motion of the human chest wall due to respiration, if the parallel imaging scan involves that area of the subject anatomy.

The process further proceeds to step S840, wherein an intermediate image corresponding to each under-sampled portion of the k-space is generated. As described previously with reference to FIG. 4, the first intermediate image and the second intermediate image can be generated based on parallel imaging techniques, perhaps in combination with such methods as partial-Fourier processing, projections onto convex sets (POCS), the homodyne method, and the like. Moreover, as stated previously, in one embodiment, a g-value map for each intermediate image can be computed.

Figure 10:
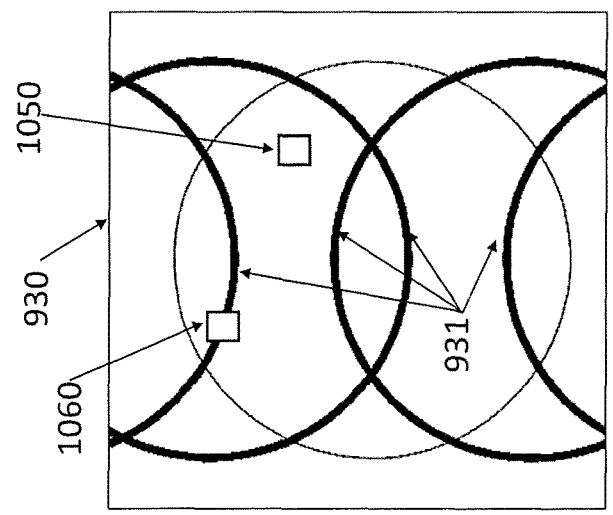
FIG. 10 illustrates an exemplary comparison of pixels in the first edge-alias map and the second edge-alias map.
Figure 10:
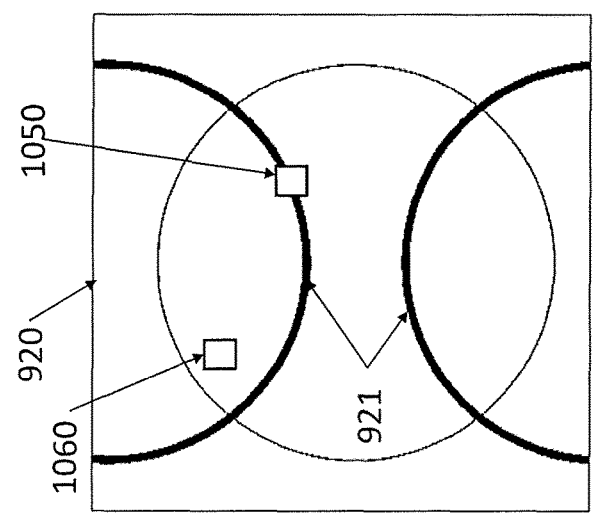

The process further continues to step S850, wherein a final image is constructed based on a comparison of the generated edge-aliased maps. Specifically, a pixel value is determined for each pixel of the final image, based on a comparison of corresponding pixels in the edge-aliased maps. For instance, FIG. 10 depicts a first edge-aliased map 920 and a second edge aliased map 930 corresponding to the k-space being under-sampled by two distinct data reduction factors. The edge-aliased maps 920 and 930 are similar to those depicted in FIG. 9, and depict the shifted edges 921 and 931, respectively in the edge-aliased maps.

For a particular pixel in the final image, the corresponding pixels (e.g., the pixels depicted at location 1050 in the first edge-aliased map 920, and the second edge-aliased map 930) are compared. By one embodiment, if the pixel 1050 in the edge-aliased map 920 is non-zero (or has a high pixel value), and the corresponding pixel in the second edge-aliased map 930 is substantially zero (i.e., has a low value), then the pixel in the final image is assigned a value that is equal to the pixel value of the pixel from the second intermediate image (i.e., the intermediate image that is generated based on the second portion of the k-space).

Similarly, if a pixel 1060 in the edge-aliased map 920 is substantially zero (i.e., has a low pixel value), and the corresponding pixel in the second edge-aliased map 930 has a high value, then the pixel in the final image is assigned a value that is equal to the pixel value of the pixel from the first intermediate image (i.e., the intermediate image that is generated corresponding to the first portion of the k-space).

In one embodiment, if pixels in both the first edge-aliased map and the second edge-aliased map have a substantially low value, the corresponding pixel in the final image is assigned a value that is a weighted combination of the corresponding pixels of the first intermediate image and the second intermediate image. According to one embodiment, a higher weighting can be applied to the pixel from the intermediate image that has a lower estimated noise level. Note that, as described previously, the noise levels of the pixels of the intermediate image can be obtained via the g-value maps that are generated for each intermediate image.

Further, in one embodiment, if pixels in both the first edge-aliased map and the second edge-aliased map have a high value, then the corresponding pixel in the final image can be assigned a value that is an average of the values of the corresponding pixels in the intermediate images. Moreover, as described previously, based on the g-value of the pixels of the intermediate images, a weighted pixel value can be assigned to the pixel in the final image.

In one embodiment, when a particular pixel in both the first edge-aliased map and the second edge-aliased map has a high value, the pixel value of the corresponding pixel in the final image is determined based on a neighborhood of nearby pixels of the particular pixel. Specifically, a combination weighting in the neighborhood of the nearby pixels (such as an average of the combination weights used in the neighborhood) is used to determine the pixel value of the pixel in the final image that corresponds to the particular pixel. Upon generating the final image, the process of FIG. 8 terminates.

While aspects of the present disclosure have been described in conjunction with the specific embodiments thereof that are proposed as examples, alternatives, modifications, and variations to the examples may be made. For instance, the k-space may be partitioned into more than two portions, wherein each portion is under-sampled at a unique data-reduction factor. Furthermore, it should be noted that, as used in the specification and the appended claims, the singular forms "a," "an," and "the" include plural referents unless the context clearly dictates otherwise.

The invention claimed is:

1. An apparatus, comprising:
   circuitry configured to
   acquire a first set of data by under-sampling a first portion of a k-space at a first rate, and acquire a second set of data by under-sampling a second portion of the k-space at a second rate,
   generate a first intermediate image and a second intermediate image based on the acquired first set of data and the acquired second set of data, respectively,
   construct a difference image based on the generated first intermediate image and the generated second intermediate image, the difference image including a plurality of artifacts, and
   reconstruct a final image by selectively combining the first intermediate image with the second intermediate image, the combining being based on identifying, for each artifact of the plurality of artifacts included in the difference image, one of the first intermediate image and the second intermediate image as being a source of the artifact.

2. The apparatus of claim 1, wherein the circuitry is further configured to construct the difference image by computing a pixel score for each pixel of the difference image, the pixel score being computed as a difference in pixel values of corresponding pixels in the first intermediate image and the second intermediate image.

3. The apparatus of claim 2, wherein the circuitry is further configured to determine a location of each artifact of the plurality of artifacts included in the difference image as being at a pixel whose computed pixel score is greater than a predetermined threshold.

4. The apparatus of claim 1, wherein the circuitry is further configured to identify the source of each artifact by determining an existence of an edge in one of the first intermediate image and the second intermediate image, the edge being disposed at a multiple of a first aliasing distance from a pixel in the first intermediate image corresponding to a location of the artifact in the difference image, and at a multiple of a second aliasing distance from a pixel in the second intermediate image corresponding to the location of the artifact in the difference image.

5. The apparatus of claim 4, wherein the circuitry is further configured to determine a pixel value for each pixel of the final image, the pixel value of a first pixel of the final image corresponding to the location of the artifact being determined as a pixel value of the corresponding pixel from one of the first intermediate image and the second intermediate image that is identified as not being the source of the artifact.

6. The apparatus of claim 5, wherein the circuitry is further configured to determine the pixel value of a second pixel of the final image that does not correspond to the location of an artifact as a weighted combination of the corresponding pixels of the first intermediate image and the second intermediate image.

7. The apparatus of claim 4, wherein the circuitry is further configured to compute the first aliasing distance based on a field of view and the first rate, and compute the second aliasing distance based on the field of view and the second rate, the first aliasing distance being different than the second aliasing distance.

8. The apparatus of claim 6, wherein the circuitry is further configured to:
   generate a g-value map for each of the first intermediate image and the second intermediate image, each generated g-value map indicating a noise level of each pixel of the first intermediate image and second intermediate image, respectively.

9. The apparatus of claim 8, wherein the circuitry is further configured to compute the weighted combination of the pixels of the first intermediate image and the second intermediate image based on the generated g-value maps.

10. The apparatus of claim 1, wherein the circuitry is further configured to select the first portion of the k-space to be substantially non-overlapping with the second portion of the k-space, and select the first rate to be different than the second rate.

11. The apparatus of claim 1, wherein the circuitry is further configured to select the first portion of the k-space to overlap entirely with the second portion of the k-space, the k-space including a plurality of data acquisition lines, a first subset of the plurality of data acquisition lines being sampled at the first rate, and a second subset of the plurality of data acquisition lines being sampled at the second rate, the first subset and the second subset including a predetermined number of shared data acquisition lines, the predetermined number being based on the first rate and the second rate.

12. A method for reducing artifacts in MRI images, the method comprising:
acquiring, by circuitry, a first set of data by under-sampling a first portion of a k-space at a first rate, and a second set of data by under-sampling a second portion of the k-space at a second rate,
generating a first intermediate image and a second intermediate image based on the acquired first set of data and the acquired second set of data, respectively,
constructing by circuitry, a difference image based on the generated first intermediate image and the generated second intermediate image, the difference image including a plurality of artifacts, and
reconstructing a final image, by selectively combining the first intermediate image with the second intermediate image, the combining being based on identifying, for each artifact of the plurality of artifacts included in the difference image, one of the first intermediate image and the second intermediate image as being a source of the artifact.

13. The method of claim 12, further comprising:
constructing by the circuitry, the difference image by computing a pixel score for each pixel of the difference image, the pixel score being computed as a difference in pixel values of corresponding pixels in the first intermediate image and the second intermediate image.

14. The method of claim 12, further comprising:
identifying by circuitry, the source of each artifact, by determining an existence of an edge in one of the first intermediate image and the second intermediate image, the edge being disposed at a multiple of a first aliasing distance from a pixel in the first intermediate image corresponding to a location of the artifact in the difference image, and at a multiple of a second aliasing distance from a pixel in the second intermediate image corresponding to the location of the artifact in the difference image.

15. The method of claim 14, further comprising:
determining a pixel value for each pixel of the final image, the pixel value of a first pixel of the final image corresponding to the location of the artifact being determined as a pixel value of the corresponding pixel from one of the first intermediate image and the second intermediate image that is identified as not being the source of the artifact.

16. The method of claim 15, further comprising:
determining the pixel value of a second pixel of the final image that does not correspond to the location of the artifact, as a weighted combination of the corresponding pixels of the first intermediate image and the second intermediate image.

17. A non-transitory computer readable medium including computer executed instructions that when executed by a computer, cause the computer to execute a method reducing artifacts in MRI images, the method comprising:
acquiring, a first set of data by under-sampling a first portion of a k-space at a first rate, and a second set of data by under-sampling a second portion of the k-space at a second rate,
generating a first intermediate image and a second intermediate image based on the acquired first set of data and acquired second set of data, respectively,
constructing a difference image based on the generated first intermediate image and the generated second intermediate image, the difference image including a plurality of artifacts, and
reconstructing a final image, by selectively combining the first intermediate image with the second intermediate image, the combining being based on identifying, for each artifact of the plurality of artifacts included in the difference image, one of the first intermediate image and the second intermediate image as being a source of the artifact.

18. The non-transitory computer readable medium of claim 17, further comprising:
computing a pixel score for each pixel of the difference image, the pixel score being computed as a difference in pixel values of corresponding pixels in the first intermediate image and the second intermediate image; and
identifying the source of each artifact, by determining an existence of an edge in one of the first intermediate image and the second intermediate image, the edge being disposed at a multiple of a first aliasing distance from a pixel in the first intermediate image corresponding to a location of the artifact in the difference image, and at a multiple of a second aliasing distance from a pixel in the second intermediate image corresponding to the location of the artifact in the difference image.

19. The non-transitory computer readable medium of claim 18, further comprising:
determining a pixel value for each pixel of the final image, the pixel value of a first pixel of the final image corresponding to the location of the artifact being determined as a pixel value of the corresponding pixel from one of the first intermediate image and the second intermediate image that is identified as not being the source of the artifact.

20. An apparatus, comprising: circuitry configured to
construct an edge-alias map corresponding to a contour of a subject, generate a first intermediate image and a second intermediate image corresponding to a first set of data acquired by under-sampling a first portion of a k-space at a first rate, and a second set of data acquired by under-sampling a second portion of the k-space at a second rate, respectively,
generate a first edge-alias map based on a first set of aliasing distances of the contour of the subject, the first set of aliasing distances being computed based on a field of view and the first rate,
generate a second edge-alias map based on a second set of aliasing distances of the contour of the subject, the second set of aliasing distances being computed based on the field of view and the second rate, and
reconstruct a final image, by selectively combining the first intermediate image with the second intermediate image, the combining being based on a comparison of the first generated edge-alias map and the second generated edge-alias map.

* * * * *